(12) United States Patent
Rubio et al.

(10) Patent No.: US 8,668,866 B2
(45) Date of Patent: Mar. 11, 2014

(54) SHOCKWAVE FABRICATION OF THERMOELECTRIC MATERIALS

(75) Inventors: Edward S. Rubio, Santa Teresa, NM (US); David Charles Nemir, El Paso, TX (US)

(73) Assignee: TXL Group, Inc., El Paso, TX (US)

( * ) Notice: Subject to any disclaimer, the term of this patent is extended or adjusted under 35 U.S.C. 154(b) by 0 days.

(21) Appl. No.: 13/441,267

(22) Filed: Apr. 6, 2012

(65) Prior Publication Data

US 2012/0207641 A1    Aug. 16, 2012

Related U.S. Application Data

(63) Continuation of application No. 12/220,156, filed on Jul. 22, 2008, now abandoned.

(60) Provisional application No. 61/007,319, filed on Dec. 12, 2007.

(51) Int. Cl.
*B22F 3/08* (2006.01)

(52) U.S. Cl.
USPC .................. 419/66; 264/84; 148/513

(58) Field of Classification Search
USPC ............................................ 148/513; 419/66
See application file for complete search history.

(56) References Cited

U.S. PATENT DOCUMENTS 4,717,627 A * 1/1988 Nellis et al. ............... 428/552
4,759,905 A * 7/1988 Walter et al. ................ 419/23

FOREIGN PATENT DOCUMENTS

WO    WO 2008048302 A2 *  4/2008

OTHER PUBLICATIONS

B Lynn Ferguson and Randall German, "Powder Shaping and Consolidation Technologies," ASM Handbook, vol. 7 (1998), pp. 313-320.*

* cited by examiner

*Primary Examiner* — Jessee Roe
*Assistant Examiner* — Christopher Kessler
(74) *Attorney, Agent, or Firm* — Winstead PC

(57) ABSTRACT

The explosive consolidation of semiconductor powders results in thermoelectric materials having reduced thermal conductivity without a concurrent reduction in electrical conductivity and thereby allows the construction of thermoelectric generators having improved conversion efficiencies of heat energy to electrical energy.

22 Claims, 2 Drawing Sheets

SHOCKWAVE FABRICATION OF THERMOELECTRIC MATERIALS

CROSS-REFERENCE TO RELATED APPLICATIONS

This application is a continuation of U.S. patent application Ser. No. 12/220,156 filed Jul. 22, 2008, now abandoned, which claims priority to U.S. provisional patent application 61/007,319 filed Dec. 12, 2007, each of which are incorporated by reference herein in their entirety.

STATEMENT REGARDING FEDERALLY SPONSORED RESEARCH

Not applicable.

FIELD OF THE INVENTION

This invention relates to the shockwave fabrication of thermoelectric materials as a means for deriving an enhanced performance. The consolidation of micro and nano-scale powders through explosive means results in a material that impedes thermal energy transmission through lattice vibrations (phonons) without negatively impacting electrical conductivity, the result being an improvement in thermoelectric conversion efficiency.

BACKGROUND

Energy is a quantity that has many forms, with electrical energy having the attractive property that it may be easily transmitted through conductors and thereby transferred to remote locations without the requirement for mechanical transport. Electrical energy may be used to generate mechanical motion through motors, and can power sensors, electronics and heaters. A less versatile manifestation of energy is thermal energy, or heat. Thermal energy may be produced as a byproduct of exothermic chemical reactions, such as the combustion of hydrocarbons in an internal combustion engine. Thermal energy may be derived from hot springs and vents in the earth's crust (geothermal energy) and as a byproduct of radioactive decay. Thermal energy may also be collected as the absorption of solar radiation.

Thermoelectric generation is the conversion of thermal energy into electrical energy without the intermediary of rotating machinery. Status quo thermoelectric generators are constructed from thermoelectric elements that are generally formed of doped semiconductors. Even the best of these suffers from inefficiencies that render them unusable for all but a limited class of applications. Transport mechanisms in solid state materials are complicated, interrelated and require detailed quantum mechanical calculations to describe. However, for the purposes of the following discussion we will focus on the effect of lattice vibrations on the thermoelectric qualities of a material. These mechanical excitations of the atoms in a solid are called phonons and they have two main undesirable effects in a thermoelectric material. The first effect is that they transmit heat directly through a material, effectively acting as a leak for thermal energy. The second effect is to scatter electrons as they travel through the material, effectively causing electrical resistance and joule heating. The present invention describes a fabrication method using shockwave powder consolidation that reduces lattice vibrations, leading to an improved thermoelectric performance.

Thermoelectric generation takes place when a temperature difference is applied to a conductor or semiconductor and causes mobile charge carriers, either electrons or holes, to migrate from hot to cold. The resulting separation of charge creates an electric field potential known as the Seebeck voltage, that is given by $\Delta V = \alpha \Delta T$, where $\alpha$ is a temperature dependent material property known as the Seebeck coefficient and, by convention, $\Delta T$ represents the temperature of the cold side with respect to the hot side. The Seebeck coefficient for a material may be positive or negative depending upon the type of majority charge carrier.

For thermoelectric devices operating around room temperature (300K), it is common to use doped alloys of tellurium, as the active elements for converting thermal energy to electrical energy. Doped bismuth-telluride (BiTe) alloys are the most popular for a temperature range of about 220K to 420K and have the attractive properties of a relatively high Seebeck coefficient $\alpha$, a relatively high electrical conductivity, $\sigma$, and a relatively low thermal conductivity $\lambda = \lambda_e + \lambda_l$ where $\lambda_e = LT\sigma$ is the portion of thermal conductivity due to electrons with T being temperature and L being the Lorentz constant, and $\lambda_l$ being the portion of thermal conductivity due to lattice vibrations (phonons). These bulk material properties are often lumped into a single figure of merit Z, where $$Z = \frac{\sigma \alpha^2}{\lambda_e + \lambda_l}. \quad (1)$$

In general, the higher the value of Z, the better the thermoelectric conversion efficiency. The parameters $\alpha$, $\sigma$, and $\lambda_l$ are temperature dependent.

Thermoelectric materials have traditionally been manufactured through a bulk process. Bulk fabrication techniques include melting and powder 10 compaction. However, for any given material, the constituents of the figure-of-merit, Z, namely, $\alpha$, $\lambda$, and S, are tightly intercoupled, so that changes that are made in chemistry or crystalline structure that influence one of these parameters in a positive way are generally offset by a negative influence on another parameter. By contrast, device fabrication on the nanoscale (with feature sizes under 20 nanometers) alters the relationship between the various constituents of Z, enabling another variable for optimization.

Z is not the only important metric for analyzing a TE device and is, at best, an average quantity. Often, thermoelectric materials are discussed in terms of the dimensionless product ZT in order to have a common reference point when discussing materials that have been optimized over different temperature ranges.

There must be an electron flow in a thermoelectric generator since the object is to supply electrical current. As such, electronic heat transfer is unavoidable and most of the focus in reducing thermal conduction has been directed at reductions in lattice (phonon) transport. Given a specific chemical make-up, thermoelectric materials may be fabricated as a single crystal, in polycrystalline form or as an amorphous (non crystalline) form. In electrically conductive substances, crystals are generally good material structures for both electron and heat transmission. Their regular structure promotes long mean free paths (mfp's) which are the mean distances that an electron or phonon travels between collisions. In contrast with a crystal, a glass exhibits no ordering between molecules and is said to have an amorphous structure. Accordingly, it has been proposed that a desirable property for a thermoelectric will be that it resembles a phonon glass and an electron crystal [G. A. Slack in CRC Handbook of Thermoelectrics, CRC Press, 1995, p. 411]. Much research has been invested into methods that scatter phonons (thus reducing their mean free path) more effectively than electrons.

One approach to building low thermal conductivity materials is to use powder sintering. The constituent materials are ground into a powder, then combined by compaction and sintering (heating). These constituent materials may be provided as individual powdered elements and then mixed and compacted and sintered. Alternately, the constituents may be prepared as a melt and then ground into a powder that is compacted and sintered. The approach of powder compaction and sintering is said to introduce disorder, lattice defects and grain boundaries which will inhibit phonon transport without excessively compromising electron transport.

U.S. Pat. No. 3,524,771 to Green describes a method for preparing thermoelectric materials consisting of small particles that are sintered to form a solid element. This approach is said to reduce thermal conductivity but at the expense of reduced electrical conductivity. U.S. Pat. No. 5,411,599 to Horn et al, describes a technique for fabricating thermoelectric materials with low thermal conductivity whereby a nanoporous structure is achieved by chemically preparing particles of a bismuth telluride based alloy and then compacting these particles. The resulting device is said to have nanoinclusions which lead to a reduced phonon conductivity. U.S. Pat. No. 6,319,744 B1 to Hoon et al., describes a technique for manufacturing thermoelectric semiconductor material by laminating strips of thin powders and then compressing and sintering to form a composite solid. U.S. Pat. No. 6,596,226 B1 to Simard describes a compaction method for alloying constituent powders in order to devise thermoelectric devices. The procedure consists of mechanically alloying the constituent elements in a powder form, compacting the resulting powder, heat treating the alloy and then extruding the resultant device. U.S. Pat. No. 7,365,265 B1 to Heremans et al, describes a technique to build thermoelectric elements using a nanogranular material which is compressed and sintered.

It is important to note that all previously proposed techniques for constructing thermoelements from powders have utilized compaction techniques as opposed to explosive consolidation. Although samples prepared using the two techniques can have identical particle densities, a consolidated sample will have maximum particle to particle bonding [K. P. Staudharnmer and L. E. Murr, "Principles and applications of shock wave compaction and consolidation of powdered materials", in Shock Waves for Industrial Applications, L. E. Murr, Editor, Noyes Publications, 1988, p. 2381. Also, when powder compaction is combined with sintering, the sintering occurs at comparably large temperatures, effectively annealing the particles. Explosive consolidation is, in effect, a relatively low temperature procedure that is not conducive to crystal formation.

U.S. Pat. Nos. 4,717,627 and 4,907,731 to Nellis et al describe a shockwave consolidation approach to the fabrication of fine grain materials having desirable superconducting or magnetic properties. U.S. Pat. No. 5,129,801 to Rabin et al describes an explosive consolidation for powders which uses an explosively propelled piston to compress a pelletized powder with particular applications to titanium carbide and alumina. These inventions propose shockwave consolidation as a means to fabricate homogeneous monoliths and do not suggest the thermoelectric advantages that will accrue from a reduction in thermal transport.

SUMMARY

In order to reduce the mean free path of phonons it is desirable for the semiconductor thermoelectric to have small crystalline structure, that is, many grain boundaries that would serve to block phonon transmission while preserving the ability for electron transmission. In this sense, we desire a "pseudo-glassy" material. One way to accomplish this is through shock wave consolidation of a powder mixture. As contrasted with powder compaction and sintering techniques, consolidation allows complete particle to particle bonding, thus producing a monolith of homogeneous properties. Shock consolidation requires the very rapid collapse of the gaps between the powder particles as well as the rapid deposition of energy at the particle surfaces. These processes must be close to adiabatic. The ultra rapid deformation and energy deposition is accomplished in time durations of microseconds by the passage of an explosively produced shock wave. The amplitude of the shock wave has to be sufficient to bond the powders but should not be so high as to produce extensive melting and cracking on subsequent reflections. The correct choice of explosive material and experimental geometry can ensure an acceptable result.

Of particular interest is the ability of shockwave fabrication to consolidate so-called nanopowders. Nanopowders are powders for which a significant proportion of the constituent particles have dimensions under 20 nanometers.

Prior art approaches to the preparation of thermoelectric materials using melts will exhibit a polycrystalline structure that does nothing to inhibit phonon transport. Prior art approaches that use powder compaction will have limited interparticle bonding. Accordingly, the present invention has the following objects and advantages for the manufacture of thermoelectric materials:

a. It maximizes interparticle bonding and thereby enhances electrical conductivity;
b. Thermoelectric materials are produced adiabatically, discouraging the formation of crystalline structures;
c. It results in a reduced lattice thermal conductivity; and
d. It yields an improved performance thermoelectric material.

None of the prior art embodiments, either alone or in combination, anticipates the present invention. Other objects, advantages and novel features, and further scope of applicability of the present invention will become apparent to those skilled in the art upon examination of the following, or may be learned by practice of the invention. The objects and advantages of the invention may be realized and attained by means of the instrumentalities and combinations particularly pointed out in the appended claims.

LIST OF REFERENCE NUMERALS

10—Electrical conductor
12—n type thermoelement
14—p type thermoelement
16—Heat source
18—Heat sink
19—Electrical conductor
20—Electrical load
22—Voltage source
24—First side
26—Second side
28—n type thermoelement 30—p type thermoelement
32—Fuse
34—Detonator
36—End cap
38—Tube
40—Thermoelectric powder
42—Explosive
44—Base
46—Outer container
48—Powder layer
50—Electrode

DETAILED DESCRIPTION

Figure 1:
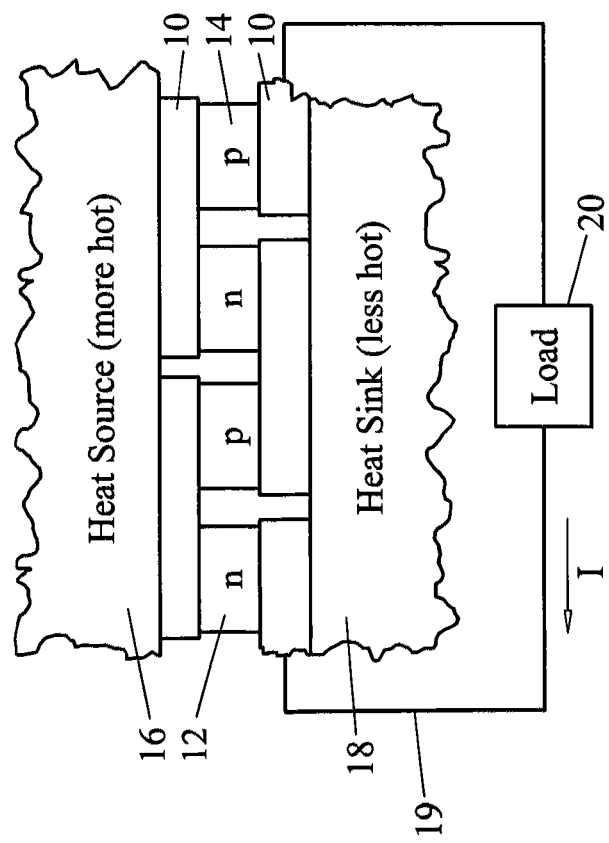
FIG. 1—Side view of a thermoelectric generator
FIG. 2—Block diagram of Peltier heat pump
FIG. 3—Apparatus for shockwave powder consolidation
FIG. 4—Layered powders allow electrode attachment

FIG. 1 depicts the side view of a typical thermoelectric generator. The generator is constructed by sandwiching specially chosen n and p type conductor or semiconductor material (the thermoelements) between electrical conductors 10. Although thermoelements may be built using conductors such as bismuth and antimony, higher efficiency thermoelectrics are built using heavily doped semiconductors. The electrical conductors 10 will be chosen to be good conductors of both electricity and heat. When fabricated from a semiconductor material, the n type thermoelement 12 is formed by the introduction of a pentavalent chemical compound so that electrons are the majority carrier. When fabricated from a semiconductor material, the p type thermoelement 14 is formed by the introduction of a trivalent chemical compound so that the majority carriers are holes. When the thermoelectric device is placed between a heat source 16 and a heat sink 18, there is a flow of heat energy from the source 16 to the sink 18. In FIG. 1, the thermoelements are connected in electrical series and thermal parallel. As heat flows from the heat source 16 to the heat sink 18, the thermal current excites an electrical current, I, which flows through a conductor 19 to an attached electrical load 20. A key figure-of-merit for thermoelectric materials is the so-called "Z" which is given by $$Z = \frac{\sigma \alpha^2}{\lambda}$$

where $\sigma$ is electrical conductivity, $\alpha$ is the Seebeck coefficient and governs the amount of voltage that is produced for a given temperature gradient ($V=\alpha \Delta T$) and $\lambda$ is the coefficient of thermal conductivity. High values of Z are desirable and this provides a roadmap for improving thermoelectric performance, namely, increase $\sigma$ and $\alpha$ and decrease $\lambda$. At temperatures in the range of 250K to 400K, alloys of bismuth-telluride exhibit the highest values of Z. N and p type thermoelectric elements are then produced by heavy doping with selenium and antimony respectively. Published desirable stochiometries for n and p type thermoelectrics are given in *Thermoelectrics Handbook, Macro to Nano*, D. M. Rowe, editor, CRC Press, Boca Raton, Fla., 2006, p. 27-9 as $(Bi_2Te_3)_{95}$ (Bi2Se3)5 for n type and $(Bi_2Te_3)_{75}(Sb_2Te_3)_{25}$ for p type.

Figure 2:
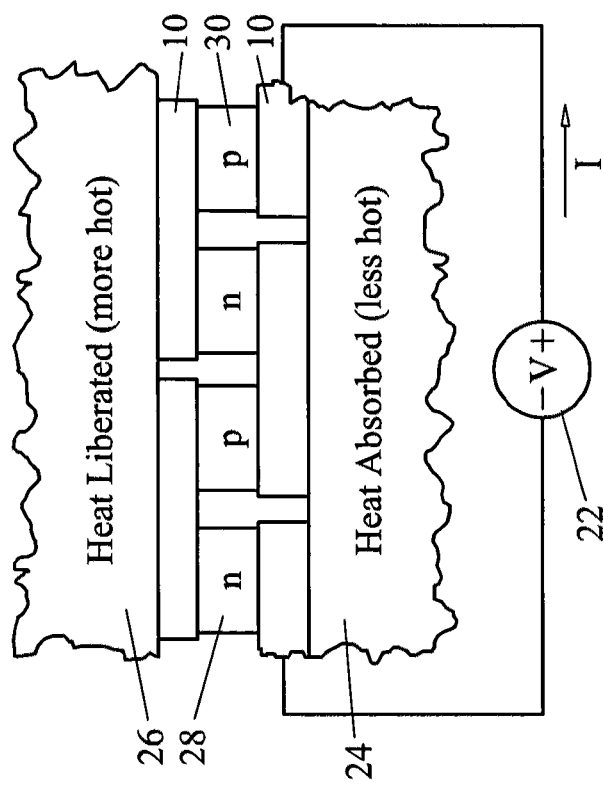

FIG. 2 depicts a Peltier heat pump. This is a thermoelectric device that can be of identical construction to the thermoelectric generator of FIG. 1, with the difference being that instead of a load, there is a voltage source 22 that causes current flow. The coupling between heat currents and electrical currents in a thermoelectric device results in the movement of heat from a first side 24 of the device to a second side 26 with the result that the first side 24 becomes cooler than the ambient temperature and the second side 26 becomes warmer than the ambient temperature. Just as for a thermoelectric generator, the n type thermoelements 28 and p type thermoelements 30 are optimized though an optimization of the figure-of-merit Z.

Figure 3:
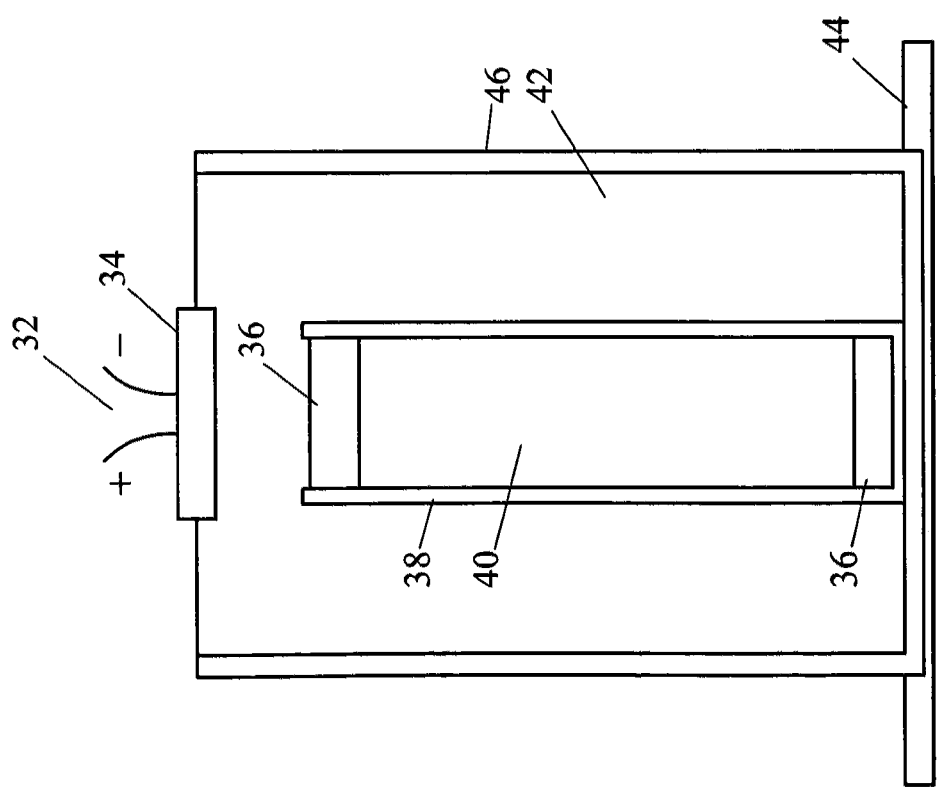

FIG. 3 depicts an apparatus for the explosive consolidation of thermoelectric powders. An outer container 46 mounted onto a base 44 supplies mechanical support. A metal tube 38 holds the thermoelectric powder 40 which is to be consolidated. The thermoelectric powder 40 may be prepared by crushing and milling a melt grown ingot that has the desired chemical composition, or the thermoelectric powder 40 may be prepared through a sol synthesis approach to chemically produce nanopowders of the correct composition, or the thermoelectric powder may be simply a mixture of elemental powders in the correct stochiometric ratio, in which case the shockwave consolidation will serve to mechanically alloy the powders into a uniform monolith having the desired make-up. The tube 38 is capped at either end with endcaps 36. The outer container 46 is then filled around the tube 38 and to the top of the outer container 46 with an explosive material 42 such as ammonium nitrate fuel oil mixture (ANFO). The explosion is initiated by a fuse 32 which sets off a detonator 34 that in turn detonates the explosive material 42.

Thermoelectric materials may be shock consolidated through the application of an explosive pressure pulse to a cylindrical container 38 of powder 40. The thermoelectric powder 40 to be consolidated is first placed within the tube 38 and green compacted. Endplugs 36 are applied to seal the tube and to maintain the powder 40 in a compacted state. The outer container 46 is not critical for strength but merely serves to contain the explosive materials 42 prior to detonation. Upon detonation, the pressure pulse converges toward the central axis of the cylinder. Shock waves cause pressures on the order of 3 to 7 GPa, causing consolidation of the powders into a solid without voids.

The result from implementing shockwave consolidation on a sample using the apparatus depicted in FIG. 3 is a cylindrical monolith of the consolidated material within the container 38. The container 38 is removed by machining off the outer layer. Thermoelectric elements may be prepared by simply cutting off slices like cutting a cucumber. These slices are then attached to electrodes to fabricate the arms of a thermoelectric generator.

Figure 4:
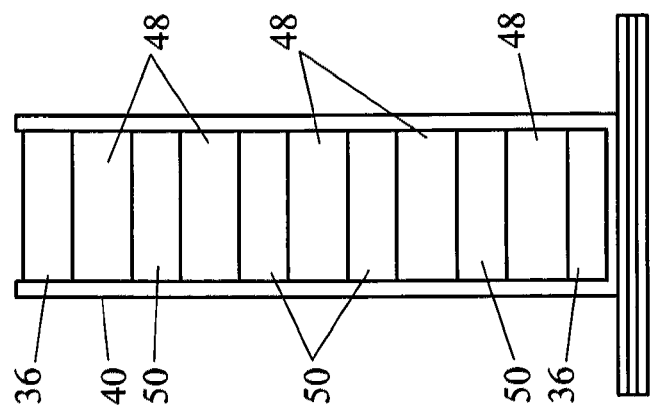

FIG. 4 depicts an alternative means for loading a tube 40 prior to explosive consolidation. Endcaps 36 are still used on the top and bottom of the tube 40. The tube 40 is loaded with alternating layers of electrode 50 and green compacted thermoelectric powder 48. Detonation causes consolidation between the thermoelectric and the electrodes 50. The result is a roll that can be cut through the centers of the electrodes 50 to yield thermoelectric elements that are already attached on either end to conductive electrodes. It is then easy to connect multiple elements in series or in parallel in order to obtain a required performance. The advantage to this approach is that the adherence between semiconductor thermoelectric material and the electrodes is performed as part of the process and is done without the requirement for secondary processing such as soldering. Another advantage is that this technique can be used as a means for producing so-called functionally graded thermoelectric elements whereby different zones within a given element are optimized for different operating temperatures. Simply use multiple layers of powder, each layer corresponding to a desired Z. The shock wave causes fusing of the various layers in a continuum. The resulting thermoelements would have a preferred orientation when used between thermal reservoirs.

One potential problem in achieving a bonding between the thermoelectric constituent powders and the electrodes is achieving a matched mechanical impedance. With a poor match (as can occur between a powder and a solid), the shock reflections may prevent a good electrical and mechanical connection between electrode and the active thermoelectric material. One alternative is to use powder for both the thermoelectric material and for the electrode. For example, by alternating layers of thermoelectric and nickel powder in a tube container, the explosive consolidation could be relied upon to create a single cylindrical monolith which could be sliced into multiple coinlike thermoelements for incorporation into a thermoelectric generator.

Although the invention has been described in detail with particular references to these preferred embodiments, other embodiments can achieve the same results. Variations and modifications of the present invention will be obvious to those skilled in the art and it is intended to cover in the appended claims all such modifications and equivalents. The entire disclosure of all references, applications, patents, and publications cited above are hereby incorporated by reference.

What is claimed is the following:

1. A method for making a thermoelectric material, said method comprising:
    placing thermoelectric powder particles in a tube;
    adding a quantity of an electrode material to the tube;
    positioning an explosive material around the tube; and
    detonating the explosive material to generate an explosive shockwave, wherein the explosive shockwave consolidates the thermoelectric powder particles into a solid body.

2. The method of claim 1, wherein the method occurs adiabatically.

3. The method of claim 1, wherein the thermoelectric powder particles comprise a nanopowder having dimensions under 20 nm.

4. The method of claim 1, wherein the thermoelectric powder particles and the quantity of the electrode material are arranged in a plurality of alternating layers.

5. The method of claim 1, wherein the electrode material is a powder.

6. The method of claim 1, further comprising cutting through each of the plurality of electrode material layers after the detonating step.

7. The method of claim 1, wherein the thermoelectric powder particles comprise an element selected from the group consisting of bismuth, tellurium, antimony, selenium and combinations thereof.

8. The method of claim 1, wherein the thermoelectric powder particles comprise a plurality of different thermoelectric substances, and each of the plurality of different thermoelectric substances is arranged as a separate layer.

9. The method of claim 1, wherein the explosive shockwave creates pressure of 3 GPa to 7 GPa.

10. A method for making a thermoelectric material, said method comprising:
    placing thermoelectric powder particles in a tube;
    adding a quantity of an electrode material to the tube;
    positioning an explosive material around the tube; and
    detonating the explosive material to generate an explosive shockwave, wherein the method occurs adiabatically, and the explosive shockwave consolidates the thermoelectric powder particles into a solid body.

11. The method of claim 10, wherein the explosive shockwave creates pressure of 3 GPa to 7 GPa.

12. The method of claim 10, wherein the thermoelectric powder particles comprise a nanopowder having dimensions under 20 nm.

13. The method of claim 10, wherein the thermoelectric powder particles and the quantity of the electrode material are arranged in a plurality of alternating layers.

14. The method of claim 10, wherein the electrode material is a powder.

15. The method of claim 10, further comprising cutting through each of the plurality of electrode material layers after the detonating step.

16. The method of claim 10, wherein the thermoelectric powder particles comprise an element selected from the group consisting of bismuth, tellurium, antimony, selenium and combinations thereof.

17. The method of claim 10, wherein the thermoelectric powder particles comprise a plurality of different thermoelectric substances, and each of the plurality of different thermoelectric substances is arranged as a separate layer.

18. A method for making a thermoelectric material, said method comprising:
    placing thermoelectric powder particles in a tube;
    adding a quantity of an electrode material to the tube, wherein the electrode material is a powder;
    capping a first and second end of the tube;
    placing the tube into an outer container;
    positioning an explosive material in the outer container around the tube; and
    detonating the explosive material to generate an explosive shockwave, wherein the method occurs adiabatically, and the explosive shockwave consolidates the thermoelectric powder particles into a solid body.

19. The method of claim 18, wherein the thermoelectric powder particles and the quantity of the electrode material are arranged in a plurality of alternating layers.

20. The method of claim 19, further comprising cutting through each of the plurality of electrode material layers after the detonating step.

21. The method of claim 18, wherein the thermoelectric powder particles comprise a plurality of different thermoelectric substances, and each of the plurality of different thermoelectric substances is arranged as a separate layer.

22. The method of claim 18, wherein the explosive shockwave creates pressure of 3 GPa to 7 GPa.

* * * * *